United States Patent
Nygard et al.

(10) Patent No.: US 7,429,943 B2
(45) Date of Patent: Sep. 30, 2008

(54) ANALOG TO DIGITAL (A/D) CONVERSION CIRCUIT HAVE A LOW DYNAMIC RANGE A/D CONVERTER

(75) Inventors: Tony M. Nygard, Terrigal (AU); Helmut C. Eder, Castle Hill (AU); Koen Van Herck, Kontich (BE)

(73) Assignee: Cochlear Limited, Lane Cove, NSW (AU)

( * ) Notice: Subject to any disclaimer, the term of this patent is extended or adjusted under 35 U.S.C. 154(b) by 0 days.

(21) Appl. No.: 11/604,853

(22) Filed: Nov. 28, 2006

(65) Prior Publication Data

US 2007/0120722 A1    May 31, 2007

Related U.S. Application Data

(60) Provisional application No. 60/859,261, filed on Nov. 16, 2006, provisional application No. 60/740,466, filed on Nov. 29, 2005.

(51) Int. Cl.
*H03M 1/12*   (2006.01)

(52) U.S. Cl. ................ 341/155; 341/139

(58) Field of Classification Search .......... 341/155, 341/139; 607/57; 379/22
See application file for complete search history.

(56) References Cited

U.S. PATENT DOCUMENTS

| | | | | |
|---|---|---|---|---|
| 4,616,210 A | * | 10/1986 | Ferber et al. | 341/122 |
| 5,379,075 A | * | 1/1995 | Nagasawa et al. | 348/678 |
| 5,490,235 A | * | 2/1996 | Von Holten et al. | 704/270 |
| 6,195,414 B1 | * | 2/2001 | Simmons et al. | 379/22 |
| 6,259,391 B1 | * | 7/2001 | Pakravan et al. | 341/139 |
| 6,452,373 B2 | * | 9/2002 | Medelius et al. | 324/72 |
| 7,224,648 B2 | * | 5/2007 | Takaba | 369/44.36 |
| 2003/0164785 A1 | * | 9/2003 | Canini et al. | 341/155 |
| 2004/0017224 A1 | * | 1/2004 | Tumer et al. | 327/51 |
| 2006/0195160 A1 | * | 8/2006 | Blamey et al. | 607/57 |

* cited by examiner

*Primary Examiner*—Peguy JeanPierre
(74) *Attorney, Agent, or Firm*—Connolly Bove Lodge & Hutz LLP (57) ABSTRACT

A low-power, high-dynamic range, analog-to-digital (A/D) conversion circuit for converting an analog signal to a digital signal having a controllable amplifier for amplifying the analog log signal received at an input of the amplifier in response to a first control signal and for generating an amplified analog signal, a low dynamic range A/D converter for converting the amplified analog signal to an intermediary digital signal, a controllable bit shift register for scaling the intermediary digital signal in response to a second control signal to generate the digital signal, and a gain control component (AGC) for generating the first control signal to cause the amplified analog signal to be within the dynamic range of the A/D converter and for generating the second control signal to cause the scaling to compensate for the amplification by the amplifier.

24 Claims, 11 Drawing Sheets

ANALOG TO DIGITAL (A/D) CONVERSION CIRCUIT HAVE A LOW DYNAMIC RANGE A/D CONVERTER

CROSS-REFERENCE TO RELATED APPLICATIONS

This application claims priority from U.S. Provisional Patent Application No. 60/740,466 entitled, "Analog to Digital (A/D) Conversion Circuit," filed Nov. 29, 2005, and U.S. Provisional Patent Application No. (To be assigned) 60/859,261, entitled, "Analog to Digital (A/D) Conversion Circuit," filed Nov. 16, 2006, which is hereby incorporated by reference herein.

BACKGROUND

Analog signal processing is commonly performed in many applications. One example is a prosthetic hearing device which processes ambient sound to supplement or provide hearing ability to individuals with various types of hearing impairments.

In recent years, rehabilitation of sensorineural hearing disorders with implantable electronic systems has acquired major importance. In particular, this applies to the group of patients in which hearing has completely failed due to accident, illness or other effects, or in which hearing is congenitally non-functional. If, in these cases, only the inner ear (cochlea), and not the neural auditory path which leads to the brain, is affected, the functional auditory nerve may be directly stimulated with electrical stimulation signals to provide a hearing perception, which may lead to sound or speech comprehension.

In these so-called cochlear™ implants, an array of stimulation electrodes is inserted into the recipient's cochlea. This array is controlled by an electronic system encased in a hermetically sealed, biocompatible housing implanted in the mastoid. The electronic system essentially contains decoder and driver circuits for the stimulation electrodes. Acoustic sound reception and conversion of acoustic signals into electrical signals typically takes place externally in a speech processor worn by the recipient. The speech processor superimposes the preprocessed signals, properly coded, on a high frequency carrier signal which, via inductive coupling, is transmitted transcutaneously to the implant through the closed skin. A microphone is located outside of the body, typically in a behind-the-ear housing worn on the external ear. The microphone is typically connected to the speech processor by a cable.

With prosthetic hearing devices as well as other similar or related audio signal processing applications, there has been a trend to process digital representations of an analog signal rather than the analog signal itself. This process, commonly referred to as digital signal processing (DSP), involves the conversion of analog signals to digital signals. A/D conversion is often performed along with other analog signal conditioning or amplification operations. As such, these initial operations are sometimes referred to as front-end operations, and the hardware and/or software components that perform such initial operations are sometimes collectively referred to as a "front end" of the speech processing pipeline.

SUMMARY

In one aspect of the invention, an analog-to-digital (A/D) conversion circuit for converting an analog signal to a digital signal is disclosed, the circuit comprising: a controllable amplifier for amplifying the analog signal received at an input of said amplifier in response to a first control signal, and for generating an amplified analog signal; a low dynamic range A/D converter for converting said amplified analog signal to an intermediary digital signal; a controllable digital multiplier circuit for adjusting said intermediary digital signal in response to a second control signal to generate said digital signal; and an automatic gain control (AGC) component for generating said first control signal to cause said amplified analog signal to be within said dynamic range of said A/D converter, and for generating said second control signal to cause said adjusting of said intermediary digital signal to compensate for said amplification by said amplifier.

In another aspect of the present invention, a prosthetic hearing implant is disclosed, the implant comprising: a microphone adapted to generate an analog signal representing a received acoustical signal; a speech processing unit configured to generate stimulation signals based on said analog signal, said speech processing unit comprising a low-power high-dynamic range analog-to-digital (A/D) conversion circuit having a low dynamic range A/D conversion circuit for converting an analog signal to a digital signal; and a stimulator unit configured to apply said stimulation signals to one or more electrodes implanted in the cochlea.

In a further aspect of the invention, a low-power, high-dynamic range, analog-to-digital (A/D) conversion circuit for converting an analog signal to a digital signal is disclosed, the circuit comprising: amplifier means for amplifying an amplitude of an analog signal received at an input of said amplifier means in response to a first control signal, and for generating an amplified analog signal; a low dynamic range A/D converter for converting said amplified analog signal to an intermediary digital signal; digital multiplier circuit means for adjusting said intermediary digital signal in response to a second control signal to generate said digital signal; and an control circuit means for generating said first control signal to cause said amplified analog signal to be within said dynamic range of said A/D converter, and for generating said second control signal to cause said adjusting of said intermediate digital signal to compensate for said amplification by said amplifier means.

In a still further aspect of the invention, a method for converting an analog signal to a digital signal, the method comprising: amplifying the analog signal in response to a first control signal; converting said amplified analog signal to an intermediary digital signal using a low dynamic range A/D converter; adjusting said intermediary digital signal, in response to a second control signal, to generate the digital signal; generating said first control signal, to cause said amplified analog signal to be within said dynamic range of said A/D converter; and generating said second control signal, to cause said adjusting of said intermediary digital signal to compensate for said amplification.

BRIEF DESCRIPTION OF THE DRAWINGS

Illustrative embodiments of the present invention are described herein with reference to the accompanying drawings, in which.

DETAILED DESCRIPTION

The present invention is generally directed to a low power, high resolution, analog-to-digital (A/D) conversion circuit. The low power consumption of this conversion circuit is attributable to the fact that it is constructed using a low dynamic range A/D converter. As is known by persons of ordinary skill in the art, a low dynamic range A/D converter component uses less power than a higher resolution A/D converter since analog signals are converted into fewer discrete values by a low dynamic range A/D converter as compared to its higher resolution counterpart.

Low dynamic range refers to a subset of the full dynamic range of sound. Within the full dynamic range of sounds, humans are able to perceive and comfortably withstand a subset of that full dynamic range, typically between 20 to 90 dB. In certain embodiments, the low dynamic range A/D converter has a dynamic range of less than or equal to approximately 72 dB. In another embodiment, the dynamic range is less than 65 dB. In a further embodiment, the dynamic range is less than 60 dB.

Typically, a 6-bit to 12-bit A/D converter may be considered a low dynamic range A/D converter for converting normal speech. However, other A/D converters having more or less bits may also be considered a low dynamic range A/D converter, so long as the number of discrete values produced is insufficient to adequately represent the speech with a precision that allows a signal recreated from the digital representation to be sufficiently similar to the original signal, for example, as perceived by an average listener.

Embodiments of the present invention may be used, for example, in many different digital signal processing (DSP) applications which may benefit from relatively low power consumption while performing analog-to-digital conversion. Such applications include, but are not limited to, prosthetic hearing devices, portable audio equipment such as wireless microphones, and others. The term "prosthetic hearing device" refers to any device that is able to assist a recipient's ability to hear sounds, improve that recipient's ability to hear sounds, or provide medical or therapeutic treatment to the auditory system. Typically such implants are used with recipients who experience some form of conductive or sensorineural hearing loss. Such devices include, but are not limited to, hearing aids, acoustic/mechanical stimulators, electrical stimulators, or hybrids thereof, such as electric-acoustic stimulators.

Examples of acoustic/mechanical stimulators include middle-ear implants, vibrating implants, or bone-anchored hearing aids. The operation of an electrical stimulator is well understood in the art, and is described, for example, in U.S. Pat. No. 4,532,930, the entire contents and disclosures of which are hereby incorporated by reference herein. Examples of electrical prosthetic hearing implants include the Nucleus™ implant and Freedom™ implant manufactured by Cochlear Limited. The prosthetic hearing device may comprise components which are completely implanted or may comprise a mix of components which are external, partially implanted or totally implanted. The prosthetic hearing implant may stimulate one or both ears, depending on the requirements of the recipient. One exemplary application in which embodiments of the present invention may be advantageously implemented is a prosthetic hearing device such as a fully- or partially-implantable cochlear™ implant (commonly referred to as cochlear™ device, cochlear™ implant system, and the like; "cochlear implant" herein).

Figure 1:
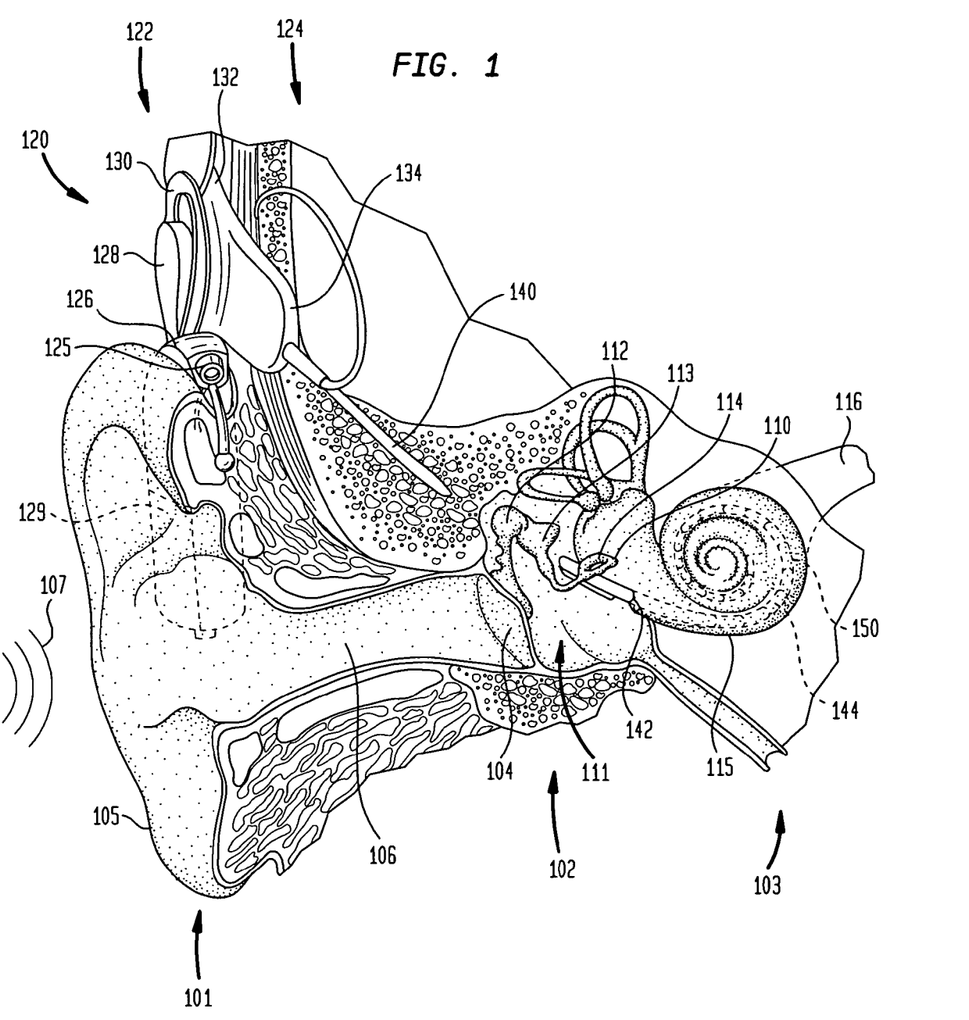
FIG. 1 is an embodiment of a cochlear implant device suitable for advantageously implementing embodiments of the present invention.

FIG. 1 is a perspective view of an illustrative example of one such cochlear implant. In fully functional human hearing anatomy, outer ear 101 comprises an auricle 105 and an ear canal 106. A sound wave or acoustic pressure 107 is collected by auricle 105 and channeled into and through ear canal 106. Disposed across the distal end of ear canal 106 is a tympanic membrane 104 which vibrates in response to acoustic wave 107. This vibration is coupled to oval window or fenestra ovalis 110 through three bones of middle ear 102, collectively referred to as the ossicles 111 and comprising the malleus 112, the incus 113 and the stapes 114. Bones 112, 113 and 114 of middle ear 102 serve to filter and amplify acoustic wave 107, causing oval window 110 to articulate, or vibrate. Such vibration sets up waves of fluid motion within cochlea 115. Such fluid motion, in turn, activates tiny hair cells (not shown) that line the inside of cochlea 115. Activation of the hair cells causes appropriate nerve impulses to be transferred through the spiral ganglion cells and auditory nerve 116 to the brain (not shown), where they are perceived as sound. In deaf persons, there is an absence or destruction of the hair cells. A cochlear implant 120 is utilized to directly stimulate the ganglion cells to provide a hearing sensation to the recipient.

FIG. 1 also shows how a cochlear implant 120 is positioned in relation to outer ear 101, middle ear 102 and inner ear 103. Cochlear implant 120 comprises external component assembly 122 which is directly or indirectly attached to the body of the recipient, and an internal component assembly 124 which is temporarily or permanently implanted in the recipient. External assembly 122 comprises microphone 125 for detecting sound which is outputted to a behind-the-ear (BTE) speech processing unit 126 that generates coded signals which are provided to an external transmitter unit 128, along with power from a power source 129 such as a battery. External transmitter unit 128 comprises an external coil 130 and, preferably, a magnet (not shown) secured directly or indirectly in external coil 130.

Internal components 124 comprise an internal receiver unit 132 having an internal coil 320 that receives and transmits power and coded signals received from external assembly 122 to a stimulator unit 134 to apply the coded signal to cochlear 115 via an implanted electrode assembly 140. Electrode assembly 140 enters cochlea 115 at cochleostomy region 142 and has one or more electrodes 150 positioned to be substantially aligned with portions of tonotopically-mapped cochlea 115. Signals generated by stimulator unit 134 are typically applied by an array 144 of electrodes 150 to cochlea 115, thereby stimulating auditory nerve 116. As one of ordinary skill in the art will appreciate from the present disclosure, embodiments of the present invention may be advantageously implemented in a variety of devices as described elsewhere herein. Although the cochlear implant described above with reference to FIG. 1 is a partially-implantable device, embodiments of the present invention provide particular benefits to devices which have limited sources of power such as fully-implantable prosthetic hearing devices including bone-anchored hearing aids, fully-implantable cochlear implants, in-the-canal hearing aids and the like.

Figure 2:
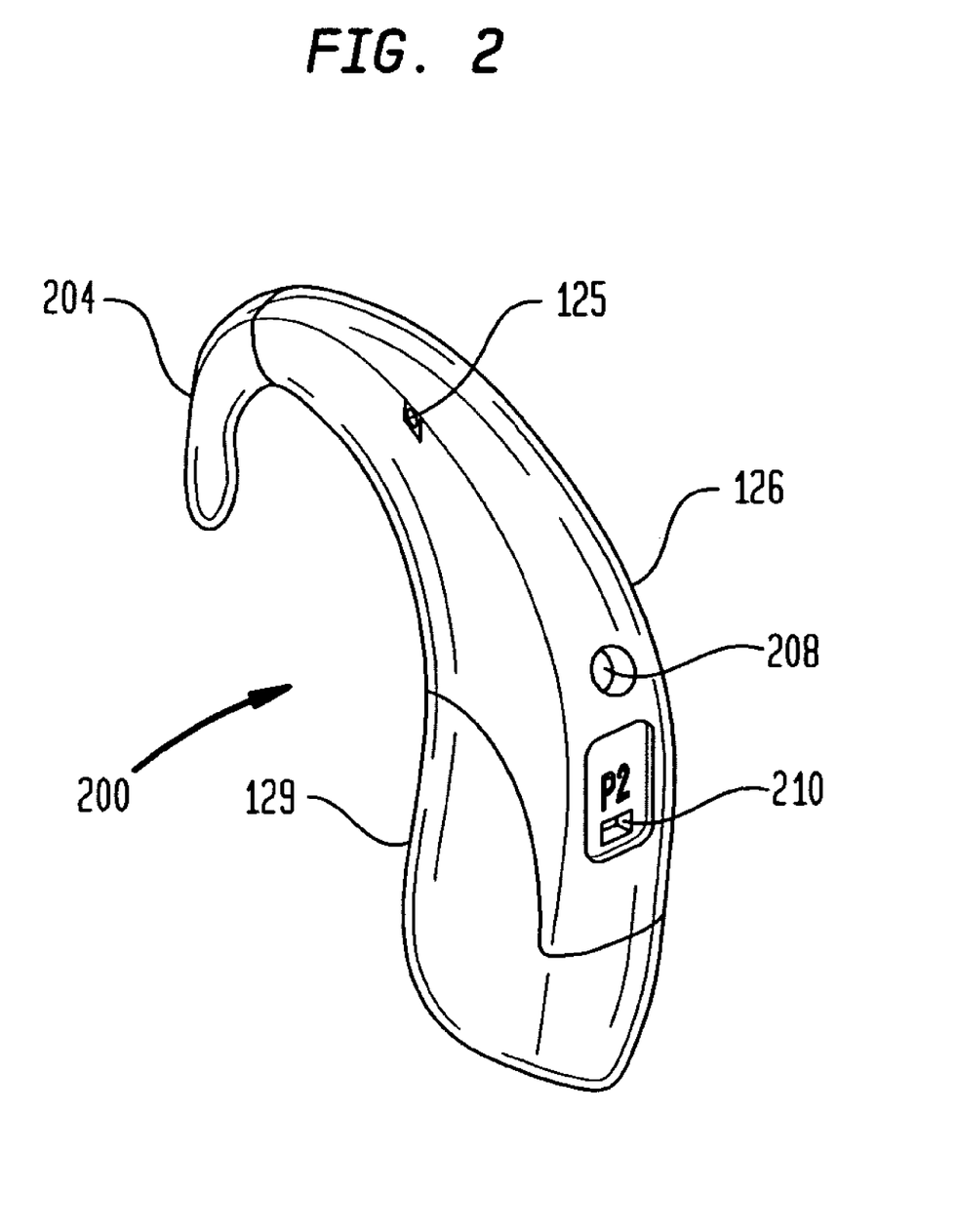
FIG. 2 is a perspective view of one embodiment of the speech processor of FIG. 1.

FIG. 2 is a perspective view of an embodiment of a behind-the-ear (BTE) speech processor 126, referred to herein as BTE speech processor unit 200. BTE speech processor unit 200 comprises signal processing circuitry (not shown). A detachable ear hook 204 is provided at one end of speech processor module 200 to be supported behind the outer ear 101 of the cochlear implant recipient. A detachable power supply 129 comprising a rechargeable battery or other power source is detachably included in speech processor module 200 to provide power to the module. Speech processor unit 200 utilizes microphone 125 that receives acoustic waves 107 and generates analog signals utilized by the signal processing circuitry housed within speech processing unit 200. Speech processor unit 200 also includes a headpiece connector 208 and an accessories connector 210 to connect to other components of the implementing cochlear implant or other prosthetic hearing device.

Figure 3:
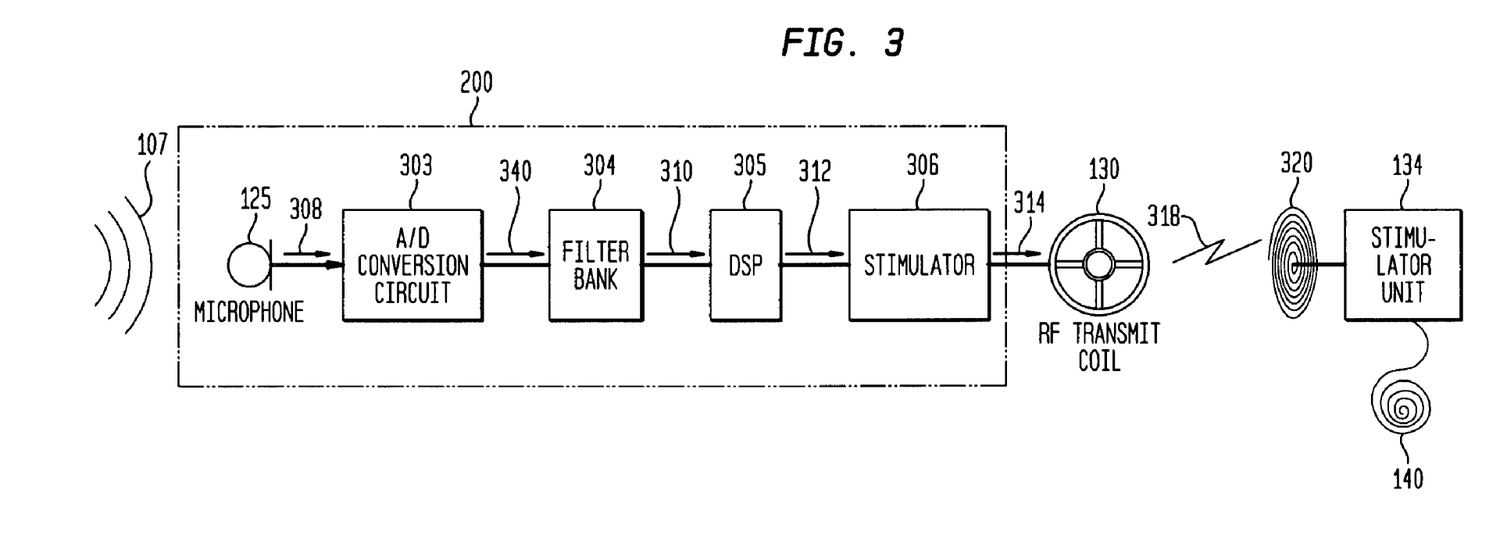
FIG. 3 is a functional block diagram of the external components of one embodiment of a cochlear implant device in accordance with one embodiment of the present invention.

FIG. 3 is a functional block diagram of an embodiment of speech processor unit 200. As noted, speech processor unit 200 is connected to microphone 125 which detects sound waves 107 and generates an analog audio signal 308 responsive to sound waves 107. In this embodiment, speech processor unit 200 comprises a low-power consumption, high-resolution analog-to-digital (A/D) conversion circuit 302 that encodes analog audio signal 308 at a specified sample rate Fs (or a multiple thereof represented as M*Fs, or its multiple represented as N*Fs), then further scales the encoded signal, prior to generating a digital signal 340 representative of the received acoustic signal 107.

Filter bank 304 receives digital signal 340 and generates one or more band-pass filtered digital signals 310 representative of analog audio signal 308. Band-pass filtered digital signals 310 are provided to digital signal processor (DSP) 305 of speech processor unit 200. DSP 305, in one embodiment, detects instantaneous energy of the audio signal in the frequency range of each band-pass filtered signal 310.

DSP 305 may select a number of maxima (i.e., the channels having the largest amplitude) in accordance with one of a variety of speech processing techniques such as the Spectral PEAK Extraction (SPEAK) or Advanced Combination Encoders (ACE) speech coding strategies or, alternatively, may implement a CIS strategy where all filter channels are used for stimulating electrode array 144. DSP 305 generates filtered channel signals and stimulation rate information, collectively 312, and presents them to a stimulator 306.

Stimulator 306 determines stimulation signals 314 for stimulating electrodes 150 of electrode array 144, including, for example, the rate of stimulation, the group of electrodes to be stimulated, and the current amplitude for stimulating electrodes 150. The received information is mapped to electrodes 150 of electrode array 144 to generate a stimulus current level for each stimulus to be applied in accordance with stimulus pulse timings. This information is provided to stimulator unit 134 through internal coil 320 via an RF signal 318 generated by transmitter coil 130.

Figure 4A:
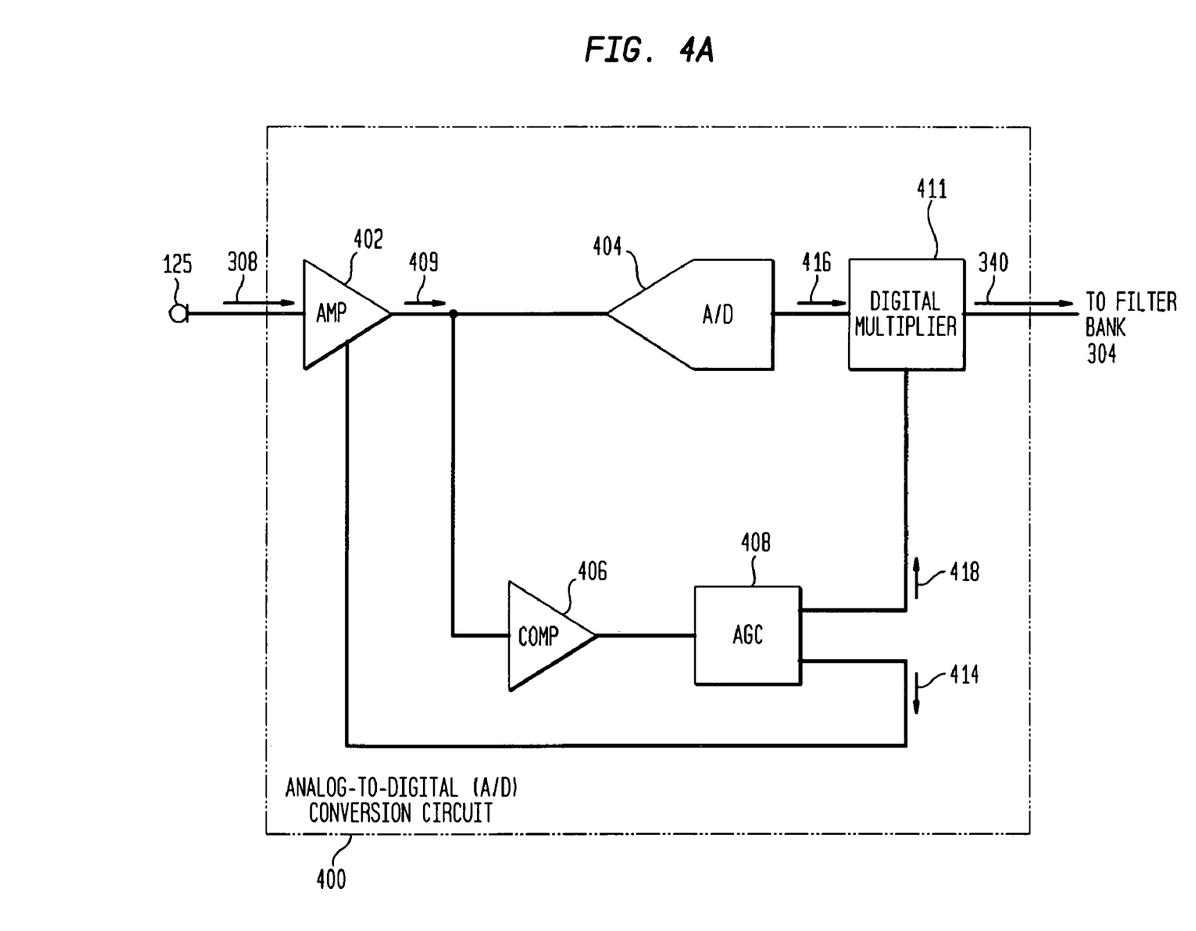
FIG. 4A is a simplified schematic diagram of an A/D conversion circuit in accordance with one embodiment of the present invention.

FIG. 4A is a simplified schematic diagram of an embodiment of A/D conversion circuit 302, referred to herein as A/D conversion circuit 400. A low-power, high-dynamic range, analog-to-digital (A/D) conversion circuit 400 comprises five basic circuit components, a controllable amplifier 402, a low dynamic range A/D converter 404, a comparator 406, an automatic gain control (AGC) 408, and a digital multiplier circuit 411.

A/D conversion circuit 400 receives analog signal 308 and converts the analog signal to a digital signal 340. The inputs of A/D converter 404 and comparator 406 are connected in parallel to the output of amplifier 402. Amplifier 402 is a controllable amplifier that amplifies analog audio signal 308 generated by microphone 125 in response to a first control signal 414 to produce amplified analog signal 409.

A low dynamic range A/D converter 404 converts the amplified analog signal 409 into an intermediary digital signal 416. A/D converter 404 converts amplified analog signal 409 into discrete digital values, and outputs intermediary digital signal 416. A/D converter has a sample rate that is a multiple of Fs, which is represented as M*Fs, or a multiple of M*Fs, which is represented as N*Fs herein. This is described in greater detail below.

Intermediary digital signal 416 is provided to a digital multiplier circuit 411 constructed and arranged to scale the intermediary digital signal to compensate for the amplification performed at amplifier circuit component 402. Digital multiplier circuit 411 contains any combination of circuit elements that enable it to perform the requisite digital gain compensation to compensate for the amplification applied by amplifier 402. Digital multiplier 411 performs such signal scaling in response to a second control signal 418, and generates the compensated intermediate digital signal at the output of conversion circuit 400 as digital signal 340. As will be described below, in various embodiments, digital multiplier 411 may be implemented with one or more bit shift registers and/or downsamplers. It should be appreciated, however, that digital multiplier circuit 402 may be implemented with any combination of circuit elements to achieve a desired scaling. In those embodiments in which the scaling is a factor of 2, then shift registers are likely to be implemented, although that need not be the case in all embodiments of the present invention.

An Automatic Gain Control (AGC) circuit element 408 generates first control signal 414 to cause amplified analog signal 409 to be within the dynamic range of A/D converter 404. AGC 408 also generates second control signal 418 to cause digital multiplier 411 to compensate for the amplification performed by amplifier 402. AGC 408 generates first and second control signals 414, 418 in response to amplified analog signal 409 which is processed through a comparator 406. Comparator 406 is connected between amplifier 402 and AGC 408, and compares amplified analog signal 409 to one or more programmable values to determine whether the value of amplified analog signal 409 is below a minimum or over a maximum threshold value.

Figure 4B:
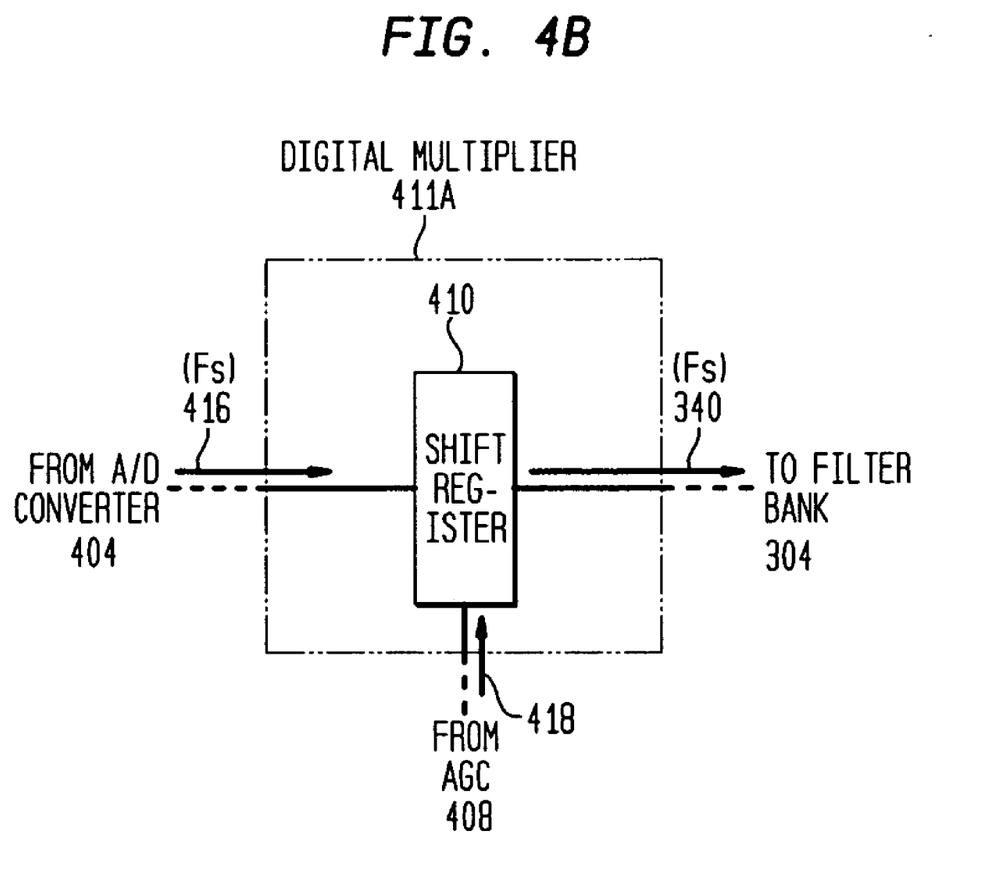
FIG. 4B is a schematic diagram of a portion the A/D conversion circuit illustrated in FIG. 4A in accordance with an embodiment the present invention.

FIG. 4B depicts an embodiment of digital multiplier 411, referred to herein as digital multiplier circuit 411A. Digital multiplier 411A comprises a shift register 410. As noted, AGC 408 controls amplifier 402 and digital multiplier 410 through first control signal 414 and second control signal 418, respectively. When the amplitude of analog signal 308 exceeds or is below the noted programmable values referenced by comparator 406, AGC 408 causes amplifier 402 to amplify incoming analog signal 308, and also causes digital multiplier 411A to perform a scaling of intermediary digital signal 416 to compensate for the amplification by amplifier 402. In other words, when AGC 408 causes amplifier 402 to increase the amplitude of analog signal 308, AGC 408 also causes shift register 410 to scale down intermediary digital signal 416 by the same amount, and vice versa. In one embodiment, increases and decreases of analog signal 308 are done in +/−6 dB gain stages, which is performed by increasing/decreasing the amplitude by a factor of two, in other words, to multiplications of 2 (to increase +6 dB) or 0.5 (to decrease −6 dB) of the amplitude. A more accurate increment is 6.02 dB since 20 log 2=6.02 dB. As is well-known by persons of ordinary skill in the art, a gain stage may be implemented using, for example, three matching capacitor or resistor units in a feedback network. In such embodiments, a compensating effect may be performed by shift register 410 as shown in FIG. 4B. In such an embodiment, bit shift register 410 bit shifts digital values left or right by one bit, thereby increasing or decreasing digital values by a factor of two.

Thus, if first control signal 414 sent by AGC 408 to amplifier 402 causes the amplitude of analog signal 308 to be increased by a multiple of +6 dB (which is performed by multiplying the analog signal amplitude by a factor of 2), then second control signal 418 sent by AGC 408 to bit shift register 410 causes intermediary digital signal 416 to be decreased by the same factor of 2. The opposite is also true, where if the amplitude of analog signal 308 is decreased by a multiple of −6 dB, the intermediary digital signal 416 will be increased by the same factor of 2 by bit shift register 410.

Figure 4C:
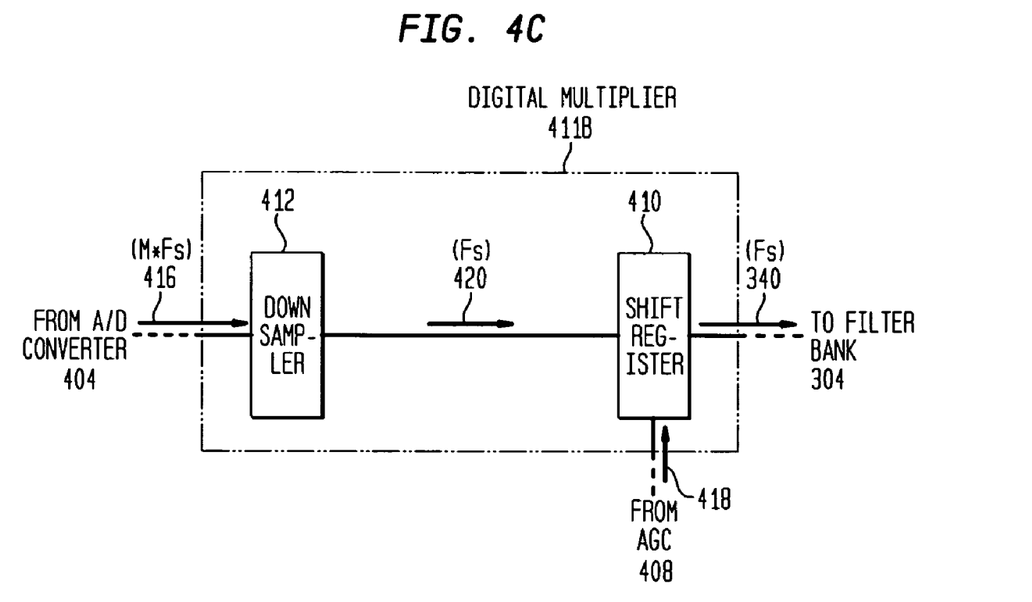
FIG. 4C is a schematic diagram of a portion the A/D conversion circuit illustrated in FIG. 4A in accordance with an embodiment the present invention.

FIG. 4C is a circuit block diagram of another embodiment of digital multiplier circuit element 411, referred to herein as digital multiplier 411B. Digital multiplier 411B comprises a downsampler 412 electrically coupled to A/D converter 404 and having an output electrically coupled to the input of a shift register 410. Shift register 410 has an output electrically coupled to filter bank 304. In this embodiment, intermediary digital signal 416 from A/D converter 404 has a sample rate of M*Fs, and is downsampled prior to being sent to shift register 410. As is known by those of ordinary skill in the art, an analog signal may be oversampled to ensure that the analog to digital conversion accurately captures the received analog signal. However, where an analog to digital converter oversamples an input analog signal, downsampling may be performed to produce a digital signal that accurately represents the original sampled analog signal 409.

Referring again to FIG. 4C, downsampler 412 downsamples intermediary digital signal 416 from a sample rate of M*Fs to Fs, to provide a second intermediary digital signal 420 to shift register 410. As described previously, shift register 410 is controlled by second control signal 418 from AGC 408, and shifts second intermediary digital signal 420 so as to increase or decrease the amplitude of second intermediary digital signal 420. The resulting scaled digital signal 440 is provided to filter bank 304.

Figure 4D:
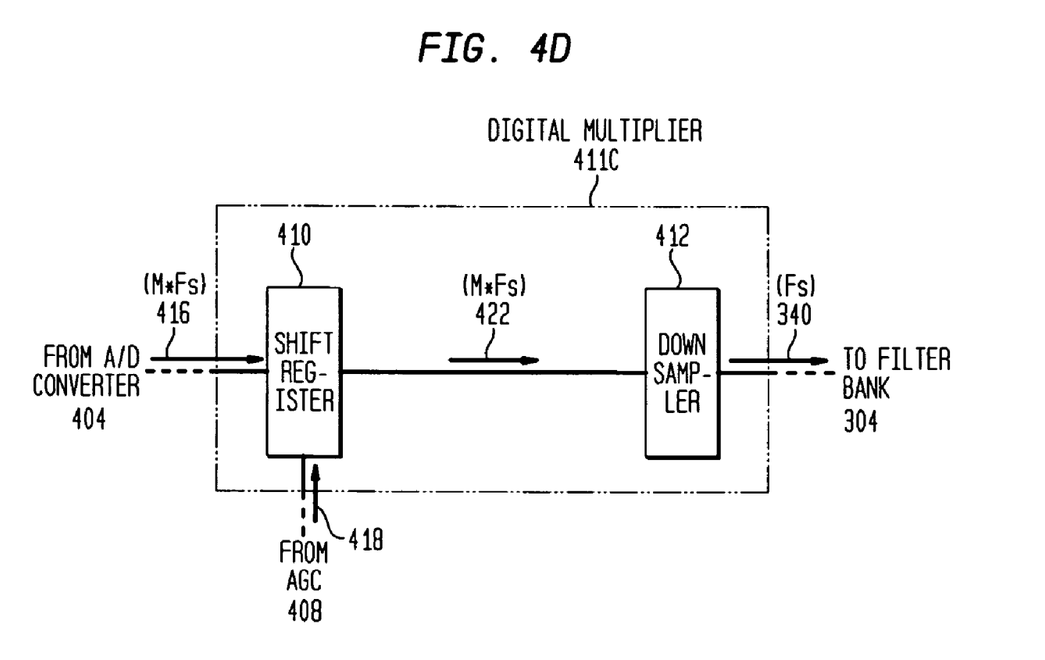
FIG. 4D is a schematic diagram of a portion the A/D conversion circuit illustrated in FIG. 4A in accordance with an embodiment the present invention.

FIG. 4D is a circuit block diagram of another embodiment of digital multiplier circuit element 411, referred to herein as digital multiplier 411C. Digital multiplier 411C comprises a shift register 410 electrically coupled to A/D converter 404 and having an output electrically coupled to the input of a downsampler 412. Downsampler 412 has an output electrically coupled to filter bank 304. In this embodiment, intermediary digital signal 416 from A/D converter 404 has a sample rate of M*Fs, and will be processed by shift register 410 before being downsampled by downsampler 412. As described previously, shift register 410 is controlled by second control signal 418 from AGC 408, and shifts intermediary digital signal 416 so as to increase or decrease the amplitude of intermediary digital signal 416, to generate a second intermediary digital signal 422. Downsampler 412 downsamples second intermediary digital signal 422 from a sample rate of M*Fs to Fs, to provide an appropriately-scaled digital signal 440 to filter bank 304.

Having downsampler 412 after bit shift register 410, as in FIG. 4D, is effective in preventing signal distortion, signal loss, in preventing noise, and for other signal quality benefits, compared to arrangements where downsampling is performed prior to being processed by bit shift register 410.

Figure 4E:
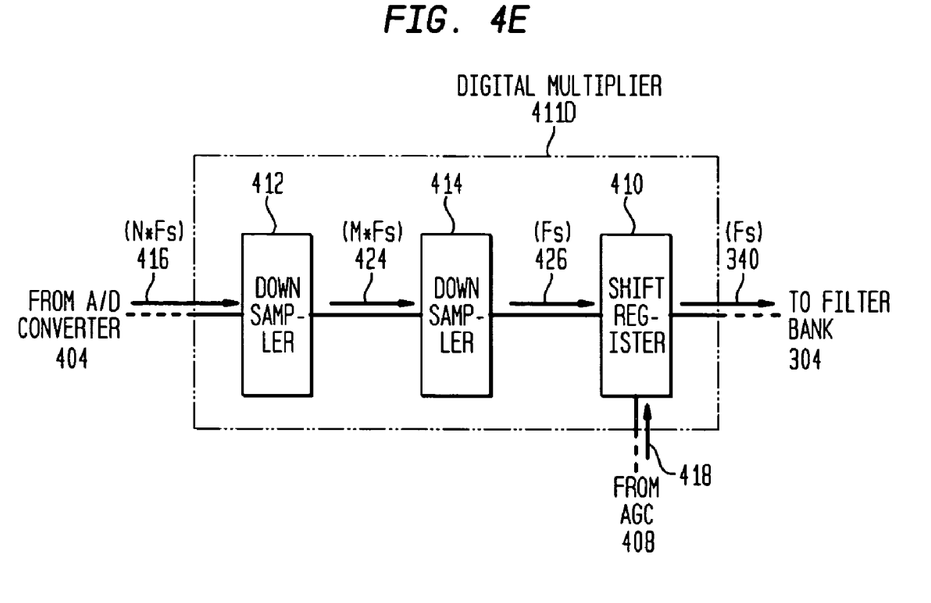
FIG. 4E is a schematic diagram of a portion the A/D conversion circuit illustrated in FIG. 4A in accordance with an embodiment the present invention.

FIG. 4E is a circuit block diagram of another embodiment of digital multiplier circuit element 411, referred to herein as digital multiplier 411D. Digital multiplier 411D comprises a first downsampler 412 electrically coupled to A/D converter 404 and having an output electrically coupled to the input of a second downsampler 414. Second downsampler 414 has an output electrically coupled to a shift register 410, which has an output electrically coupled to a filter bank 304. In this embodiment, intermediary digital signal 416 from A/D converter 404 has a sample rate of N*Fs, which is a multiple of M*Fs, which is itself a multiple of Fs. Intermediary digital signal 416 is downsampled by first downsampler 412, to generate second intermediary digital signal 424 having a sample rate of M*Fs. Second intermediate digital signal 424 is downsampled by second downsampler 414 to generate third intermediary digital signal 426 having a sample rate of Fs. Third intermediate digital signal 426 is provided to shift register 410 which performs shifting operations to generate digital signal 440. As described previously, shift register 410 is controlled by second control signal 418 from AGC 408, and shifts third intermediary digital signal 426 so as to increase or decrease the amplitude of the signal. The resulting digital signal 340 is provided to filter bank 304.

Figure 4F:
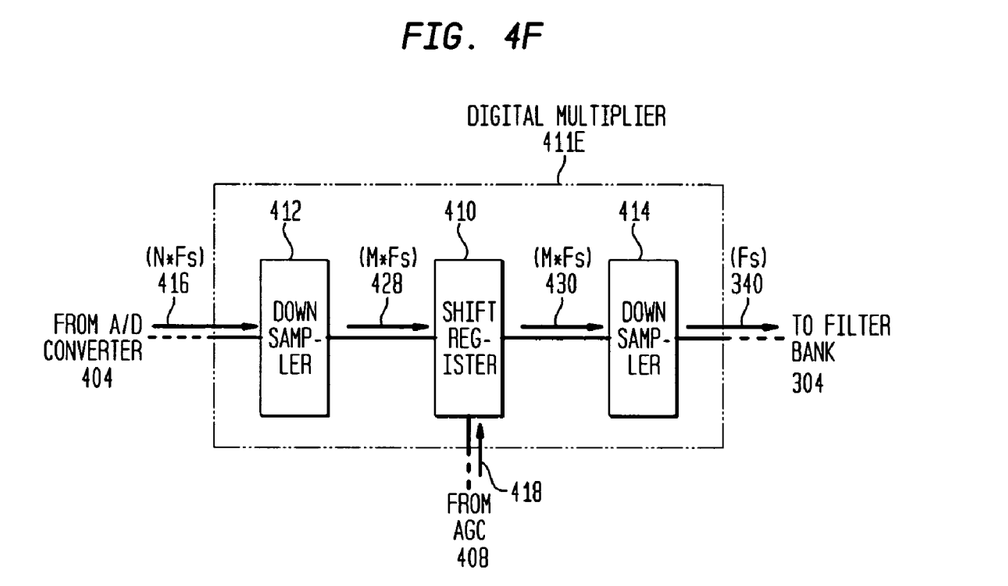
FIG. 4F is a schematic diagram of a portion the A/D conversion circuit illustrated in FIG. 4A in accordance with an embodiment the present invention.

FIG. 4F is a circuit block diagram of another embodiment of digital multiplier circuit element 411, referred to herein as digital multiplier 411E. Digital multiplier 411E comprises a first downsampler 412 having an input electrically coupled to A/D converter 404 and having an output electrically coupled to the input of a shift register 410. Shift register 410 has an output electrically coupled to a second downsampler 414 which has an output electrically coupled to filter bank 304. In this embodiment, intermediary digital signal 416 from A/D converter 404 has a sample rate of N*Fs, which is a multiple of M*Fs, which is itself a multiple of Fs. First downsampler 412 downsamples intermediary digital signal 416, to generate second intermediary digital signal 428 having a sample rate of M*Fs. Second intermediate digital signal 428 is provided to shift register 410 which performs shifting operations, as previously described, on the signal to generate third intermediary digital signal 430. Second downsampler downsamples third intermediary digital signal 430 to generate digital signal 340 which has a sample rate of Fs. As noted, shift register 410 is controlled by second control signal 418 from AGC 408, and shifts intermediary digital signal 428 so as to increase or decrease the amplitude of the signal. Digital signal 340 is then provided to filter bank 304.

Having downsampler 414 electrically coupled after bit shift register 410, as in FIG. 4F, is effective in preventing signal distortion and signal loss, in preventing noise, and for other signal quality benefits, compared to arrangements where all downsampling is performed prior to being processed by bit shift register 410.

Figure 4G:
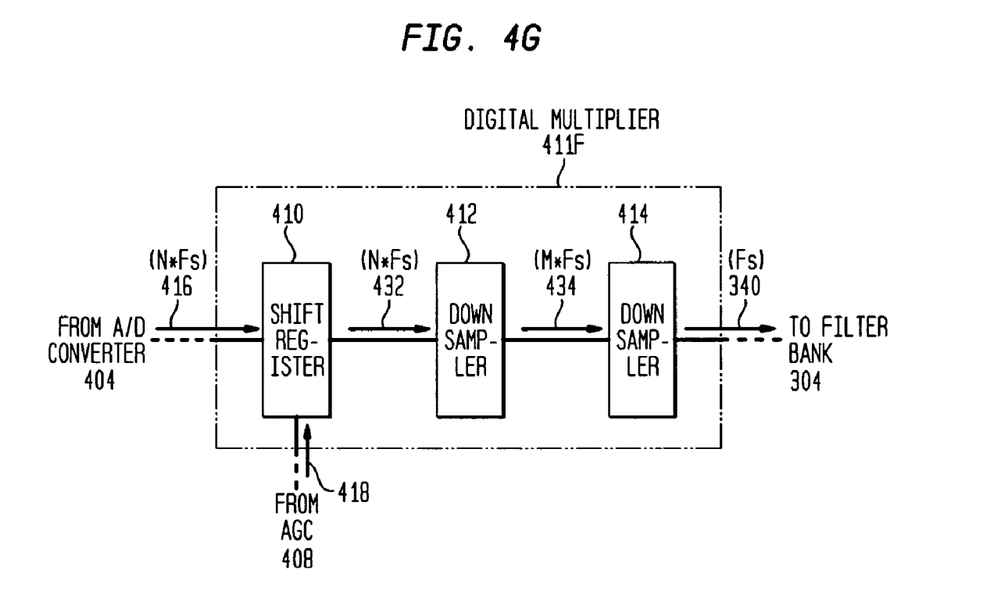
FIG. 4G is a schematic diagram of a portion the A/D conversion circuit illustrated in FIG. 4A in accordance with an embodiment the present invention.

FIG. 4G is a circuit block diagram of another embodiment of digital multiplier circuit element 411, referred to herein as digital multiplier 411F. Digital multiplier 411F comprises a shift register 410 electrically coupled to A/D converter 404 and an output electrically coupled to the input of a first downsampler 412. First downsampler 412 has an output electrically coupled to a second downsampler 414, which has an output electrically coupled to filter bank 304. In this embodiment, intermediary digital signal 416 from A/D converter 404 has a sample rate of N*Fs, which is a multiple of M*Fs, which is itself a multiple of Fs. The intermediary digital signal 416 is provided to shift register 410, which performs shifting operations on the signal to generate second intermediary digital signal 432 having a sample rate of N*Fs. First downsampler 412 downsamples second intermediary digital signal 432 to generate third intermediary digital signal 434 having a sample rate of M*Fs. Second downsampler downsamples third intermediary digital signal 434 to generate digital signal 340 which has a sample rate of Fs. As described previously, shift register 410 is controlled by second control signal 418 from AGC 408, and shifts intermediary digital signal 416 so as to increase or decrease the amplitude of the signal. Digital signal 340 is then provided to filter bank 304.

Having downsamplers 412 and 414 after bit shift register 410, as in FIG. 4G, is effective in preventing signal distortion and signal loss, in preventing noise, and for other signal quality benefits, compared to arrangements where downsampling is performed prior to being processed by bit shift register 410.

It should be noted that although the embodiments depicted in FIGS. 4E, 4F, and 4G are described and drawn as having a first and second downsampler, any number of separate downsampling operations may be performed. Therefore, it should be understood that the blocks showing "first downsampler" and "second downsampler" can be implemented via one or more downsamplers.

Figure 5:
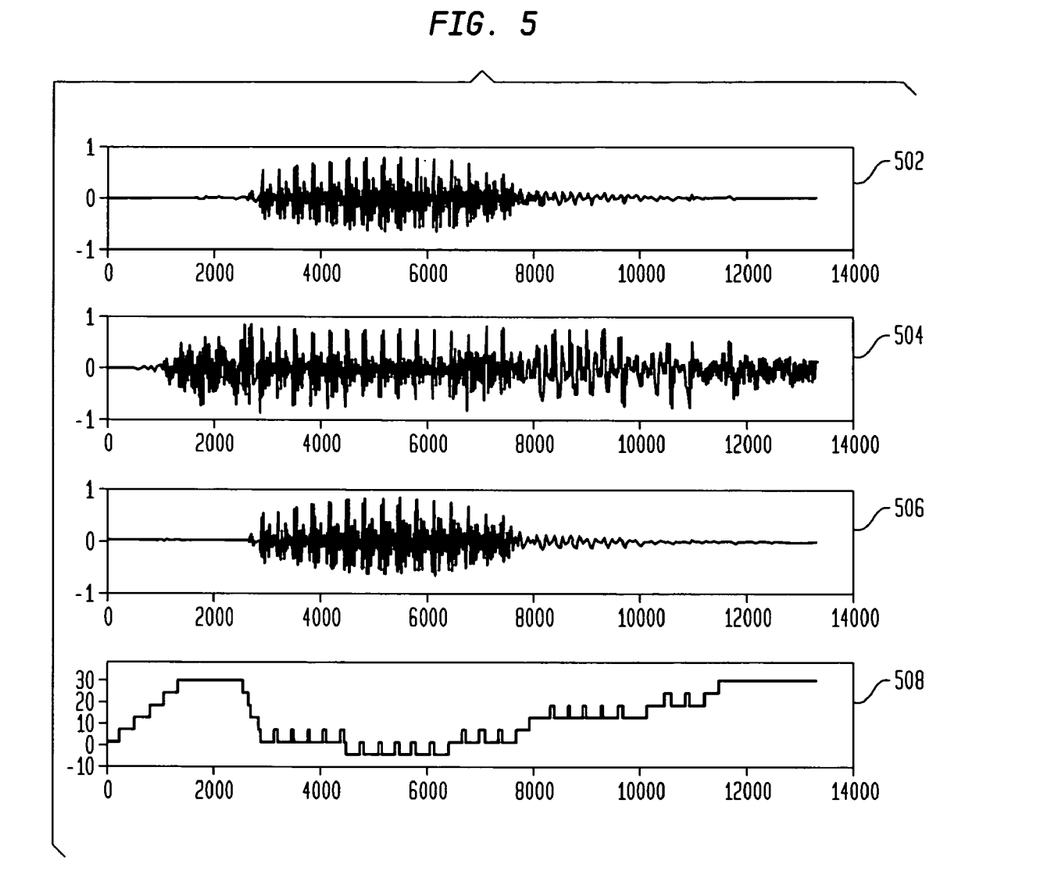
FIG. 5 is a series of related graphs along time from a MATLAB simulation of a cochlear implant implementing an embodiment of the A/D conversion circuit of the present invention.

FIG. 5 shows a result 500 from a MATLAB simulation of a cochlear implant 120 implementing A/D conversion circuit 302. The audio signal 107 being received and processed is the input word "hood" 502. The analog signal generated by microphone 125 is adjusted by amplifier 402 to generate waveform 504. As noted, amplifier 402 adjusts the amplitude of the analog signal in response to control inputs generated by AGC 408. Output digital signal from A/D converter 404, as restored by bit shift register 410, is shown by waveform 506. The applied gain is shown by waveform 508.

By using the above described coordinated amplification and compensating bit shifting and this invention, A/D conversion circuit 400 is able to generate digital signal 310 of input analog signal 308 with a higher dynamic range than would conventionally be possible when using low dynamic range A/D converter 404 without this invention. At the same time, low dynamic range A/D converter 404, along with the conversion circuit 400, will consume less power, as previously described. In order to carry out this invention, additional components such as AGC 408 are necessary, and those additional components will consume power. However, the additional power consumption caused by the introduction of AGC 408, in addition with the other circuitry components that are necessary to properly implement the invention, is still lower than the power consumption of using a high dynamic range A/D converter without AGC 408 and associated circuitry components. In other words, rather than using a high dynamic range A/D converter alone to convert analog signal 308 from microphone 125 into digital form, the present invention uses a low resolution (and therefore lower power consuming) A/D converter 404 in conjunction with the various components as described, to consume lower power while achieving a signal conversion of comparable quality.

While various embodiments of the present invention have been described above, it should be understood that they have been presented by way of example only, and not limitation. It will be apparent to persons skilled in the relevant art that various changes in form and detail can be made therein without departing from the spirit and scope of the invention. For example, an anti-alias filter (AAF) may be placed before amplifier 402, in order to avoid aliasing. Thus, the breadth and scope of the present invention should not be limited by any of the above-described exemplary embodiments, but should be defined only in accordance with the following claims and their equivalents. All patents and publications discussed herein are incorporated in their entirety by reference thereto.

What is claimed is:

1. An analog-to-digital (A/D) conversion circuit for converting an analog signal to a digital signal comprising:
   a controllable amplifier for amplifying the analog signal received at an input of said amplifier in response to a first control signal, and for generating an amplified analog signal;
   a low dynamic range A/D converter for converting said amplified analog signal to an intermediary digital signal;
   a controllable digital multiplier circuit for scaling said intennediary digital signal in response to a second control signal to generate said digital signal; and
   an automatic gain control (AGC) component for generating said first control signal to cause said amplified analog signal to be within said dynamic range of said A/D converter, and for generating said second control signal to cause said adjusting of said intermediary digital signal to compensate for said amplification by said amplifier.

2. The conversion circuit of claim 1, wherein said digital multiplier circuit comprises:
   a bit shift register scaling configured to bit shift said intermediary signal such that said intermediary signal is enlarged if the analog signal amplitude was reduced by said amplifier, and such that said intermediary signal is reduced if the analog signal amplitude was enlarged by said amplifier.

3. The conversion circuit of claim 2, wherein said analog signal amplification is performed by adjusting the amplitude by a factor of two, and wherein said scaling is performed by shifting said intermediate signal by a quantity of bits to the right if the analog signal was enlarged during said amplifying, or to the left if the analog signal was reduced during said amplifying.

4. The conversion circuit of claim 2, wherein said digital multiplier further comprises:
   one or more downsampler circuit components series connected with each other and with said bit shift register between the output of said A/D converter and an output of said conversion circuit.

5. The conversion circuit of claim 1, further comprising:
   at least one comparator component series connected with and between said amplifier and said AGC component.

6. The conversion circuit of claim 1, wherein such digital multiplier comprises:
   one or more downsampler circuit components series connected with each other and with said bit shift register between the output of said A/D converter and an output of said conversion circuit.

7. The conversion circuit of claim 6, wherein at least one of said one or more downsampler components is series connected between said A/D converter and said bit shift register.

8. The conversion circuit of claim 6, wherein at least one of said one or more downsampler components is series connected between said bit shift register and an output of said conversion circuit.

9. A prosthetic hearing implant comprising:
a microphone adapted to generate an analog signal representing a received acoustical signal;
a speech processing unit configured to generate stimulation signals based on said analog signal, said speech processing unit comprising a low-power high-dynamic range analog-to-digital (A/D) conversion circuit having a low dynamic range A/D conversion circuit for converting an analog signal to a digital signal;
a stimulator unit configured to apply said stimulation signals to one or more electrodes implanted in the cochlea;
wherein said A/D conversion circuit comprises:
a controllable amplifier for amplifying the analog signal received at an input of said amplifier in response to a first control signal, and for generating an amplified analog signal;
said low dynamic range A/D converter configured to convert said amplified analog signal to an intermediary digital signal;
a controllable digital multiplier for scaling said intermediary digital signal in response to a second control signal to generate said digital signal; and
an automatic gain control (AGC) component for generating said first control signal to cause said amplified analog signal to be within said dynamic range of said A/D converter, and for generating said second control signal to cause said adjusting of said intermediary digital signal to compensate for said amplification by said amplifier.

10. The prosthetic hearing implant of claim 9, wherein said digital multiplier comprises:
a bit shift register scaling configured to bit shift said intermediary signal such that said intermediary signal is enlarged if the analog signal amplitude was reduced by said amplifier, and such that said intermediary signal is reduced if the analog signal amplitude was enlarged by said amplifier.

11. The prosthetic hearing implant of claim 10, wherein said digital multiplier further comprises:
one or more downsampler circuit components series connected with each other and with said bit shift register between the output of said A/D converter and an output of said conversion circuit.

12. The prosthetic hearing implant of claim 9, wherein said analog signal amplification is performed by adjusting the amplitude by a factor of two, and wherein said scaling is performed by shifting said intermediate signal by a quantity of bits to the right if the analog signal was enlarged during said amplifying, or to the left if the analog signal was reduced during said amplifying.

13. The prosthetic hearing implant of claim 9, wherein said A/D conversion circuit further comprises:
at least one comparator component series connected with and between said amplifier and said AGC component.

14. The prosthetic hearing implant of claim 9, wherein said digital multiplier further comprises:
one or more downsampler circuit components series connected with each other and with said bit shift register between the output of said A/D converter and an output of said conversion circuit.

15. The prosthetic hearing implant of claim 14, wherein at least one of said one or more downsampler circuit components is series connected between said A/D converter and said bit shift register.

16. The conversion circuit of claim 14, wherein at least one of said one or more downsampler circuit components is series connected between said bit shift register and an output of said conversion circuit.

17. A low-power, high-dynamic range, analog-to-digital (A/D) conversion circuit for converting an analog signal to a digital signal comprising:
amplifier means for amplifying an amplitude of an analog signal received at an input of said amplifier means in response to a first control signal, and for generating an amplified analog signal;
a low dynamic range A/D converter for converting said amplified analog signal to an intermediary digital signal;
digital multiplier means for adjusting said intermediary digital signal in response to a second control signal to generate said digital signal; and
an control circuit means for generating said first control signal to cause said amplified analog signal to be within said dynamic range of said A/D converter, and for generating said second control signal to cause said adjusting of said intermediate digital signal to compensate for said amplification by said amplifier means.

18. The conversion circuit of claim 17, wherein said digital multiplier means comprises:
a bit shift register scaling configured to bit shift said intermediary signal such that said intermediary signal is enlarged if the analog signal amplitude was reduced by said amplifier means, and such that said intermediary signal is reduced if the analog signal amplitude was enlarged by said amplifier means.

19. The conversion circuit of claim 18, wherein said amplifier means adjusts the amplitude by a factor of two, and wherein said bit shift register shifts said intermediate signal by a quantity of bits to the right if the analog signal was enlarged during said amplifying, or to the left if the analog signal was reduced during said amplifying.

20. The conversion circuit of claim 18, wherein said digital multiplier means further comprises:
one or more downsampler circuit components series connected with each other and with said bit shift register between the output of said A/D converter and an output of said conversion circuit.

21. The conversion circuit of claim 17, wherein said control circuit means further comprising:
at least one comparator component series connected with and between said amplifier means and said control circuit means.

22. The conversion circuit of claim 17, wherein said digital multiplier means comprises:
one or more downsampler circuit components series connected with each other and with said bit shift register between the output of said A/D converter and an output of said conversion circuit.

23. The conversion circuit of claim 22, wherein at least one of said one or more downsampler components is series connected between said A/D converter and said bit shift register.

24. The conversion circuit of claim 22, wherein at least one of said one or more downsampler components is series connected between said bit shift register and an output of said conversion circuit.

* * * * *